United States Patent [19]

Nishitoku

[11] Patent Number: 4,876,569
[45] Date of Patent: Oct. 24, 1989

[54] IMAGE EXPOSURE APPARATUS

[75] Inventor: Yukitsugu Nishitoku, Kanagawa, Japan

[73] Assignee: Fuji Photo Film Co., Ltd., Kanagawa, Japan

[21] Appl. No.: 242,459

[22] Filed: Sep. 9, 1988

[30] Foreign Application Priority Data

Sep. 9, 1987 [JP] Japan .................... 62-225580

[51] Int. Cl.$^4$ ............................................. G03B 27/72
[52] U.S. Cl. .......................................... 355/68; 355/69; 355/70
[58] Field of Search ................. 355/68, 69, 14 E, 30, 355/70

[56] References Cited
U.S. PATENT DOCUMENTS 4,383,758  5/1983  Honda et al. .................. 355/68

Primary Examiner—L. T. Hix
Assistant Examiner—D. Rutledge
Attorney, Agent, or Firm—Sughrue, Mion, Zinn, Macpeak & Seas

[57] ABSTRACT

Apparatus for performing imagewise exposure of a light-sensitive material whose spectral sensitivity is dependent on wavelength, uses a light source that emits light at a wavelength in the neighborhood of a narrow wavelength range and which is compensated for variations in its optical output level and wavelength on account of the change in the temperature of the light source. A drop in the exposure sensitivity of the light-sensitive material is prevented and a high-quality image is produced by electrically compensating for variations in the optical output level of the light source on the basis of the sensitivity vs. wavelength characteristics of the light-sensitive material and the wavelength vs. temperature characteristics of the light source so that the light source will produce a constant optical output in spite of the variations in wavelength due to the changes in its temperature. The apparatus also produces a high-quality color image having high color densities and good color balance by controlling the optical output levels of respective one of a plurality of sources of light at different wavelengths so that the exposure sensitivities of the light-sensitive material for different lights will not deteriorate in the face of temperature-dependent variations in the wavelengths of light emitted from the respective light sources.

10 Claims, 6 Drawing Sheets

---- PRIOR ART
—— THE PRESENT INVENTION

—·—UNCOMPENSATED
---- PRIOR ART
—— THE PRESENT INVENTION

---- PRIOR ART
—— THE PRESENT INVENTION

TEMPERATURE (T)

IMAGE EXPOSURE APPARATUS

BACKGROUND OF THE INVENTION

1. Field of the Invention

The present invention relates to an image exposure apparatus furnished with control means for compensating for variations in the temperature of a light source. More particularly, the present invention relates to an image exposure apparatus in which a light-sensitive material whose spectral sensitivity is dependent on wavelength, i.e., which has high sensitivity characteristics for light having one or more predetermined wavelengths, is exposed by illumination with a source of light having a wavelength in a narrow range, and which is so designed that the variations in optical output level and wavelength due to changes in the temperature of the light source are compensated to ensure that the exposure sensitivity of the light-sensitive material will always be greater than a certain value in the face of the changes in the temperature of the light source.

2. Disclosure of the Prior Art

Conventional image exposure apparatus used to expose light-sensitive materials in printing and copying processes employ light souces in the form of light-emtting devices such as semiconductor lasers (herinafter referred to as LD) or light-emitting diodes (LED). These light sources experience great variations in optical output level and wavelength on account changes in their temperataure and it has been required to control them so that they are properly compensated for the temperature change.

The optical output levels of light sources have direct effects on the exposure level of light-sensitive materials and the variation in this parameter will cause such problems as unevenness of exposure in the image formed by printing or copying. In order to avoid these problems, control has been practiced to compensate for the change in the temperature of light sources in such a way that they will produce constant levels of optical output during their operation.

The capability of controlling the temperature change in such a way that it is compensated for to produce a constant optical output level is commonly referred to as automatic power control (APC) and is generally performed by the following procedure: the optical output level of a light source is detected with a photodetector employing a light-receiving device (hereinafter referred to as PD); the detected optical output level is compared with a preset reference level; the output value of the comparator, which is either an analog or digital signal, is fed back to the drive circuit for the light source; and value of the drive current is controlled in such a way as to produce a constant optical output level.

A prior art APC circuit using a semiconductor laser (LD) as a light source and a light-receiving device (PD) as a photodetector is shown diagrammatically in FIG. 8. The APC circuit generally indicated by 20 in FIG. 8 has the following circuit configuration. One of the two terminals of LD light source 12 is connected to a drive source (LD driver) 14 via a resistor $R_1$ and the other terminal is grounded. PD 16 is disposed at the position where it is capable of receiving rays of light emitting from the LD light source 12, and one of the two terminals of PD 16 is connected to the negative (−) input terminal of an operational amplifier 17, with the other terminal of PD 16 being grounded. The positive (+) input terminal of op amp 17 is grounded. The output of op amp 17 is fed back to its negative input via a resistor $R_2$. The output terminal of the op amp 17 is also connected to the negative (−) imput terminal comparator 18 via a resistor $R_3$.

The positive (+) input terminal of comparator 18 is supplied with a reference voltage produced by dividing a predetermined negative voltage $-V$ with a divider circuit composed of a variable resistor $VR_1$ and a fixed resistor $R_4$. The resistor $R_4$ is grounded. The output terminal of the comparator 18 is connected to the drive source 14.

In the circuit shown in FIG. 8, the optical output of LD 12 is detected with PD 16 and a current proportional to the detected optical output will flow through PD 16. The current flowing through PD 16 is subjected to current/voltage (I/V) conversion in op amp 17 and the output voltage signal is supplied to the negative input terminal of comparator 18. The positive input terminal of comparator 18 is supplied with a voltage which maintains a predetermined reference level by virtue of the divider circuit composed of resistor $R_4$ and variable resistor $VR_1$. Comparator 18 compares the input signal at its negative terminal with the reference level and feeds back the result of the comparison to the drive source 14. The feed back signal controls the drive current flowing through the drive source 14 in such a way that LD 12 will produce a constant optical output level. If the voltage of the input signal at the negative terminal of the comparator 18 is lower than the reference level at its positive terminal, the drive current flowing through the drive source 14 is reduced. In the opposite case, the drive current is increased. In this way of control, the optical output level of LD 12 is maintained at a constant value.

The circuit shown in FIG. 8 is capable of maintaining a constant optical output level from a light source in the face of a change in its temperature but this circuit has no provision against the variation in wavelength that is experienced by the light source when its temperature changes. This causes serious problems in the case where light sources producing wavelengths in narrow ranges are employed to expose a color light-sensitive material. Since the color light-sensitive material has such spectral sensitivity characteristics that the necessary sensitivities are attained in only narrow regions of wavelengths, a change in the wavelength of light emitting from a certain light source will reduce the sensitivity for exposure of the light-sensitive material to such a level that the desired color density cannot be attained. In addition, the colors produced are not exact enough to ensure a desired color balance.

In order to solve these problems, an attempt has been made to keep the temperature of light sources constant by furnishing them with a suitable device such as a Peltier device. However, this direct method has the disadvantage of increasing not only the size but also the cost of the overall equipment.

The prior art is described below in greater detail with reference to FIG. 4. FIG. 4a shows the sensitivity vs. wavelength characteristics of a typical color light-sensitive material having maximum sensitivities at 650 nm (red light), 532 nm (green light) and 425 nm (blue light). Suppose here that this color light-sensitive material is exposed with three LD light sources emitting red, green and blue light at 650 nm, 532 nm, and 425 nm, respectively. These LDs have wavelength vs. temperature emitting blue light at 425 nm has the oscillating spectrum indicated by y at the appropriate operating temperature. The oscillating spectrum of this LD is shifted to x at a lower temperature, and to z at a higher temperature. As shown, if the LD of interest is not operating at the appropriate temperature, the oscillating wavelength of blue light which should be at position y (425 nm) shifts to either x or z. Therefore, even if the optical output level of the LD is the same at position x, y or z in the blue range, the color light-sensitive material is exposed to blue light having a spectrum peak at x or z and the resulting sensitivity is lower than that attained by exposure to blue light having a spectrum peak y. Similar problems will occur with red and green lights and the sensitivity of the color light-sensitive material to exposing light drops on account of variations in wavelength.

In applications such as a color recording apparatus that employs a color light-sensitive material which has spectral sensitivity characteristics and which is to be exposed with a plurality of light sources that emit light having different wavelengths in narrow ranges, the wavelength ranges of sensitivity of this light-sensitive material cannot be increased. It has therefore been strongly desired to compensate for the variations that occur in the wavelength of light from each light sources on account of the change in its temperature.

SUMMARY OF THE INVENTION

The present invention generally relates to an improvement in an apparatus for performing imagewise exposure of a light-sensitive material whose spectral sensitivity is dependent on wavelength (i.e., which has high sensitivity only in a selected wavelength range), using a light source that emits light at a wavelength in the neighborhood of a narrow wavelength range and which is compensated for the variations that occur in its optical output level and wavelength on account of the change in the temperature of the light source.

An object of the present invention is to provide an image exposure apparatus which is capable of preventing a drop in the exposure sensitivity of the light-sensitive material and producing a record of high-quality image by electrically compensating for the variations in the optical output level of the light source at low cost and in an exact way on the basis of the sensitivity vs. wavelength characteristics of the light-sensitive material and the wavelength vs. temperature characteristics of the light source so that said light source will produce a constant optical output in spite of the variations in wavelength due to the changes in its temperature.

Another object of the present invention is to provide an image exposure apparatus that performs exposure of a color light-sensitive material with a plurality of light sources emitting light having different wavelengths and which is capable of producing a record of high-quality color image having high color densities and a good color balance by controlling the optical output levels of the respective light sources at low cost and in an exact way so that the exposure sensitivities of the light-sensitive material for different lights will not deteriorate in the face of the temperature-dependent variations in the wavelengths of light emitted from the respective light sources.

In accordance with the general aspect of the present invention, there is provided an image exposure apparatus which comprises: a light source for exposing a light-sensitive material with light having a predetermined wavelength; a drive source for driving said light source; a photodetector for detecting the optical output of said light source; a comparator for comparing the detected optical output level with a reference level; a temperature detector for detecting the change in the temperature of said light source; and control means which controls the optical output level of the light source on the basis of both the temperature change signal detected with said temperature detector and the output signal from said comparator in such a way that the exposure sensitivity of said light-sensitive material will not deteriorate in the face of the variation in the wavelength of light from said light source that occurs on account of the change in its temperature.

In a preferred embodiment, said control means has a memory for storing the wavelength vs. temperature characteristics of the light source and the sensitivity vs. wavelength characteristics of the light-sensitive material, and an arithmetic processing unit which, in response to said temperature change signal, computes an optical output level for preventing the deterioration of the exposure sensitivity of said light-sensitive material on the basis of said wavelength and sensitivity characteristics, and which outputs an optical output control signal for controlling said drive source in such a way that said light source will produce the computed optical output level.

In another preferred embodiment, the optical output control signal produced from said control means is supplied to the reference level input of said comparator and controls said reference level in such a way that the output signal from said comparator is supplied to said drive source so as to control the optical output level of said light source.

In still another preferred embodiment, said control means has a memory for storing the wavelength vs. wavelength characteristics of the light source and the sensitivity vs. wavelength characteristics of the light-sensitive material, and an arithmetic processing unit which, in response to said temperature change signal and the output signal from said comparator, computes an optical output level for preventing the deterioration of the exposure sensitivity of said light-sensitive material on the basis of said wavelength and sensitivity characteristics, and which outputs an optical output control signal for controlling said drive source in such a way that said light source will produce the computed optical output level.

In yet another preferred embodiment, the output signal from said comparator is supplied to the control means and the optical output control signal computed by said control means on the basis of said output signal is directly supplied to the drive source so as to perform direct control on the optical output level of the light source.

Preferably, the image exposure apparatus has a plurality of light sources adapted to form a color image and which are each provided with an associated set of said drive source, said photodetector, said comparator and said temperature detector.

In a preferred embodiment, said plurality of light sources are three in number and emit red, green and blue light, respectively.

In another preferred embodiment, said plurality of light sources are three in number and emit red, green and infrared light, respectively.

In still another preferred embodiment, said single light source or three light sources are in the form of a semiconductor laser or a light-emitting diode.

DETAILED DESCRIPTION OF THE INVENTION

The image exposure apparatus of the present invention is described below in greater detail with reference to the preferred embodiments shown in the accompanying drawings.

Figure 1:
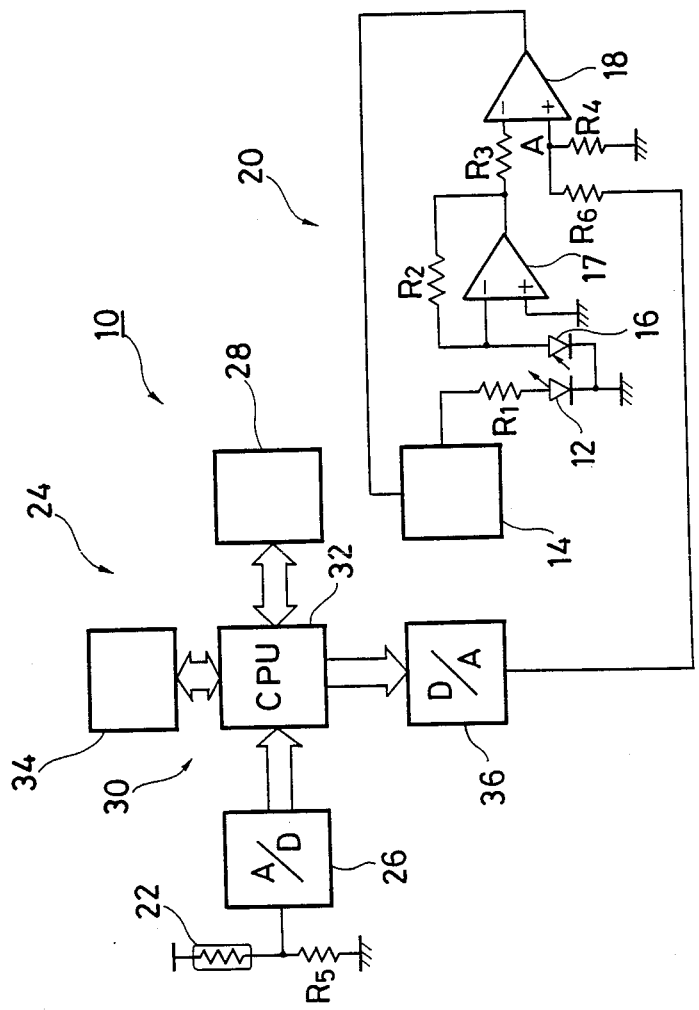
FIG. 1 is a block diagram of an image exposure apparatus according to one embodiment of the present invention.

FIG. 1 is a block diagram of an image exposure apparatus according to one preferred embodiment in which a semiconductor laser (LD) is used as a light source and a light-receiving device (PD) as a photodetector.

As shown in FIG. 1, the image exposure apparatus generally indicated by 10 includes the following components an APC circuit 20 having a light source 12 in the form of a semiconductor laser (LD) that emits light having a predetermined wavelength for exposing a light-sensitive material whose spectral sensitivity is dependent on wavelength (i.e. having high sensitivity for a predetermined wavelength range), a drive source 14 for driving the light source 12, a photodetector 16 in the form of a light-receiving device (PD) for detecting the optical output of the light source 12, and a comparator 18 for comparing the level of the detected optical output with a reference level; a temperature detector 22 for detecting the change in the temperature of the light source 12; and control means 24.

Figure 8:
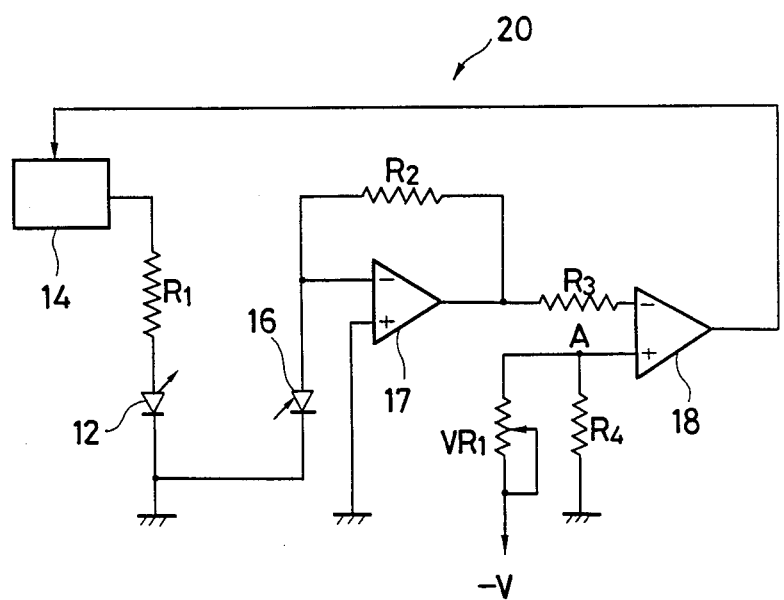
FIG. 8 is a prior art image exposure apparatus which automatically controls only the optical output level of a light source.

The configuration of the APC circuit shown in FIG. 1 is the same as what is depicted in FIG. 8 except for the positive (+) input terminal of the comparator 18, so the components which are the same as those shown in FIG. 8 are identified by like numerals and will not be explained in detail.

Besides the LD shown in FIG. 1, the light source 12 may be made of another light-emitting device such as a light-emitting diode (LED). The photodetector 16 preferably uses a light-receiving device as shown in FIG. 1 and typical examples of the light-receiving device are a photodiode and a phototransistor. Another example of the photodetector 16 is such that it has an electronic circuit employing the above-described light-receiving device.

The temperature detector 22 uses a thermo-sensitive device such as a thermistor. The output terminal of the detector 22 is divided in two branches, one of which is grounded via a resistor $R_5$ while the other is connected to an analog/digital (A/D) converter 26 in the control means 24.

The control means 24 includes a memory 28 and an arithmetic processing unit 30. The memory 28 stores at least the wavelength vs. temperature characteristics of the light source 12 and the sensitivity vs. wavelength characteristics of the light-sensitive material. The arithmetic prosessing unit 30 includes a central processing unit (CPU) 32 and a computing circuit 34. CPU 32 is so designed that it recieves an output signal from the A/D converter 26, performs signal transfer to and from each of the memory 28 and the computing circuit 34, and transmits an output signal to a D/A conveter 36. Stated more specifically, CPU 32 receives from the A/D converter 26 the temperature change signal detected by the temperature detector 22; the CPU also recieves information about the wavelength and sensitivity characteristics stored in the memory 28. The CPU then transmits such signal and information to the computing circuit 34. On the basis of the supplied information and signal, the computing circuit 34 computes an optical output level for preventing the deterioration of the exposure sensitivity of the light-sensitive material and transmits the results of the computation to CPU 32, which then transmits an optical output control signal to the D/A converter 36 so as to control the drive source 14 in such a way that the light source 12 will produce the computed optical output level.

The output terminal of the D/A converter 36 is connected via a resistor $R_6$ to the positive (+) input terminal, and the reference level input, of the comparator 18 in the APC circuit 20. After D/A conversion, the optical output control signal from CPU 32 is fed to the reference level input of the comparator 18 and controls the reference level to become equal to the computed level of optical output.

As described above, even if the wavelength of light from the light source varies on account of a change in its temperature, the APC circuit 20 shown in FIG. 1 is capable of correctly controlling the level of the optical output from this light source by using as a reference the level of optical output that will not cause any change in the sensitivity of the light-sensitive material.

In the embodiment shown in FIG. 1, the reference level is variable and controlled by inputting an optical output control signal from the control means 24 at point A of comparator 18 in the APC circuit 20. Alternatively, the circuit of the image exposure apparatus may be configured as shown in FIG. 2 wherein the reference level at point A of comparator 18 is held constant and the output of the comparator 18 is supplied not to the drive source 14 but to the computing circuit 34 in the control means 24, with the optical output control signal from the control means 24 being directly supplied to the drive source 14.

Figure 2:
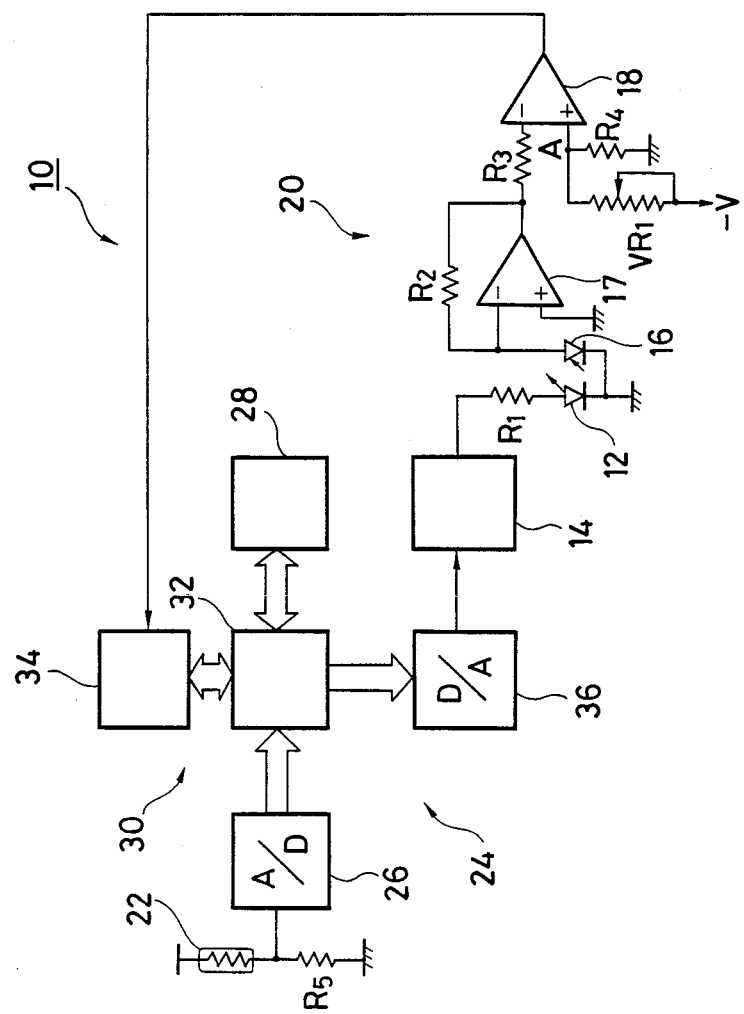
FIG. 2 is a block diagram of an image exposure apparatus according to another embodiment of the present invention.

In the embodiment shown in FIG. 2, the output of the comparator 18 is directly supplied to the computing circuit 34 in the control means and an optical output level that will not deteriorate the exposure sensitivity of the light-sensitive material is computed on the basis of both the information from the memory 28 (i.e., the wavelength vs. temperature characteristics of the light source 12 and the sensitivity vs. wavelength characteristics of the light-sensitive material) and the temperature change signal from the temperature detector 22. The computed optical output level is transmitted to CPU 32 and D/A converter 36, where it receives D/A conversion and thence is fed directly to the drive source 14.

Both the embodiments shown in FIGS. 1 and 2 are intended to compensate for the variation in the optical output level of a single light source that occurs as a result of wavelength variation due to the change in its temperature. It should however be noted that the concept of the present invention is also applicable to an image exposure apparatus that employs a plurality of light sources, for example, three or four light sources, for the purpose of forming a color image on color light-sensitive materials including silver halide light-sensitive materials for use in making various types of photographic print and for making printing plates, silver halide light-sensitive materials such as those of the diffusion transfer type and of the thermal development type, as well as a variety of thermo-sensitive and/or pressure-sensitive type light-sensitive materials.

The three light sources used to form color image are preferably those which emit red, green and blue light, or those which emit red, green and infrared light, and the choice of suitable light sources depends on the specific type of light-sensitive material to be exposed. If the light-sensitive material has the sensitivity vs. wavelength characteristics shown in FIG. 4a, three light sources that emit red light at 650 nm, green light at 532 nm and blue light at 425 nm are preferably employed.

Figure 3:
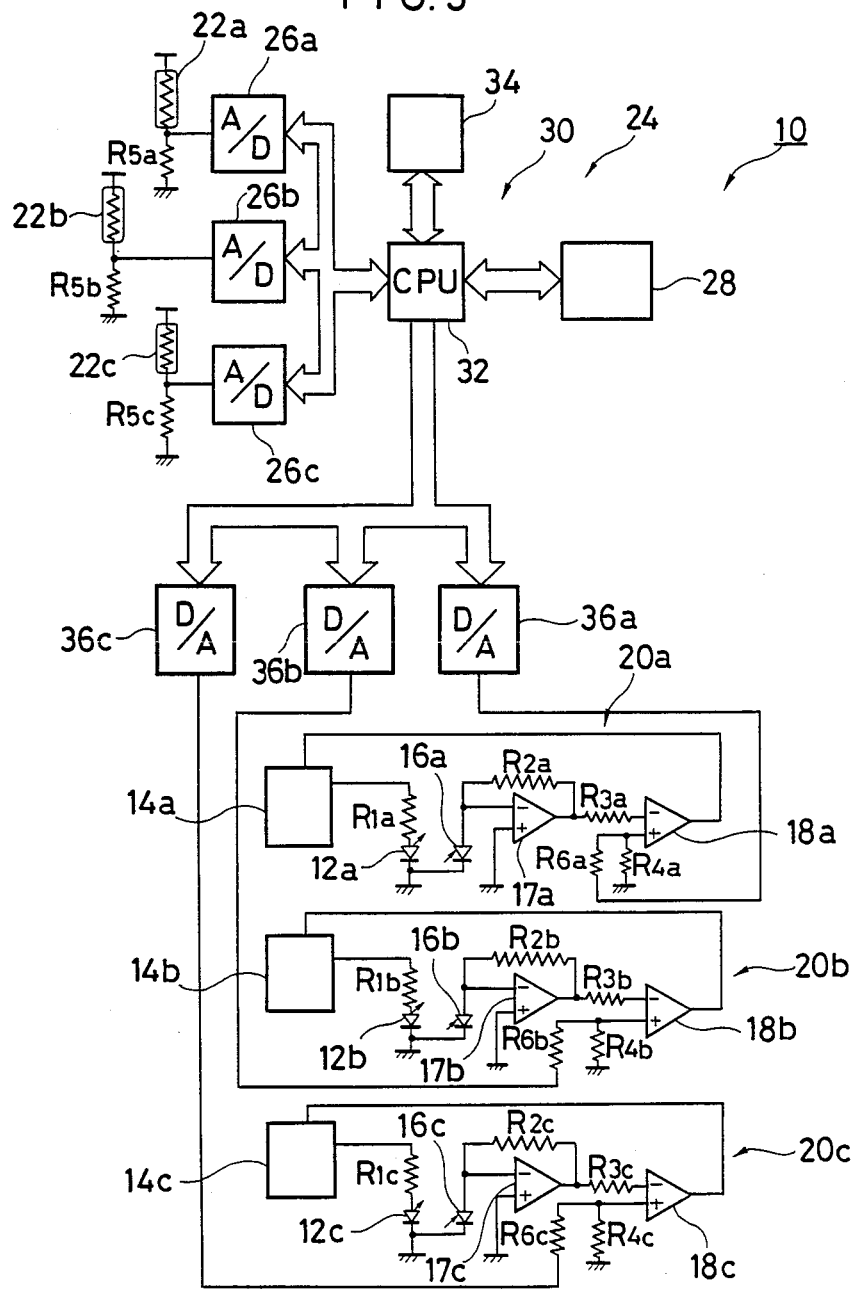
FIG. 3 is a block diagram of an image exposure apparatus according to still another embodiment of the present invention which employs three light sources.

FIG. 3 shows a third embodiment of the present invention in which three light sources are employed. The circuit shown in FIG. 3 has the following components: three APC circuits 20a, 20b and 20c that are respectively associated with red/green/blue or red/green/infrared light emitted from three different color light sources 12a, 12b and 12c; three D/A converters 36a, 36b and 36c for performing D/A conversion on the optical output control signals to be transmitted to the APC circuits 20a, 20b and 20c; three temperature detectors 22a, 22b, and 22c that detect the changes in the temperatures of the three different color light sources 12a, 12b and 12c; three stabilizing resistors $R_{5a}$, $R_{5b}$ and $R_{5c}$; and three A/D converters 26a, 26b and 26c that respectively perform A/D conversion on the temperature change signals outputted from the temperature detectors 22a, 22b and 22c.

The A/D converted signals indicating the changes in the temperatures of the light sources 12a, 12b and 12c are sent to a single CPU 32 at predetermined time intervals. Needless to say, a memory 28 is loaded with the wavelength vs. temperature characteristics of each light source and the sensitivity characteristics of the light-sensitive material as a function of the wavelength of light emitted from each light source. These pieces of information are transmitted to the CPU 32 and an optical output level from each light source that enables the light-sensitive material to maintain a predetermined level of exposoure sensitivity in the face of a change in the temperature of each light source is computed in a computing circuit 34. The computed optical output level is transmitted to CPU 32, which supplies the D/A converter circuits 36a, 36b and 36c with optical output control signals that allow the respective light sources 12a, 12b and 12c to produce the computed levels of optical output.

The supplied optical output control signals are transmitted to point A of comparators 18a, 18b and 18c in the APC circuits 20a, 20b and 20c that are respectively associated with light sources 12a, 12b and 12c, and these signals control the reference levels for the levels of the optical outputs from the respective light sources.

Each of the APC circuits 20a, 20b and 20c has the same composition as the APC circuit shown in FIG. 1 (or FIG. 8) and need not be explained in detail. Subscripts a, b and c may be taken to refer to the three colors of light sources, for example, red, green and blue.

The image exposure apparatus shown in FIG. 3 which employs three different color light sources is so designed that both the APC circuit and the temperature detector are provided in association with each of the light sources as in the embodiment shown in FIG. 1. Alternatively, each of the three light sources may be provided with a circuit of the type shown in FIG. 2 wherein the output of the comparator in each associated APC circuit is transmitted to the computing circuit in the control means so as to directly control the drive source for each light source.

OPERATION

The image exposure apparatus of the present invention which has the basic composition described on the foregoing pages will be operated as explained below specifically with reference to FIGS. 1 and 4a-7.

Figure 4A:
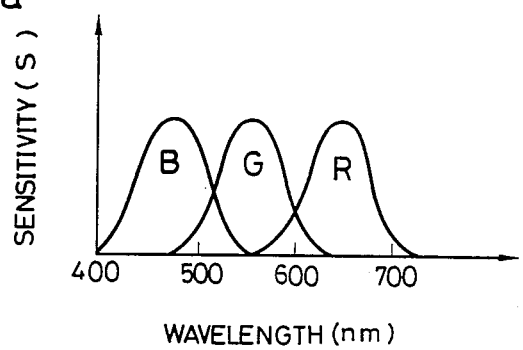
FIG. 4a is a graph showing the sensitivity vs. wavelength characteristics of a typical light-sensitive material.
Figure 5:
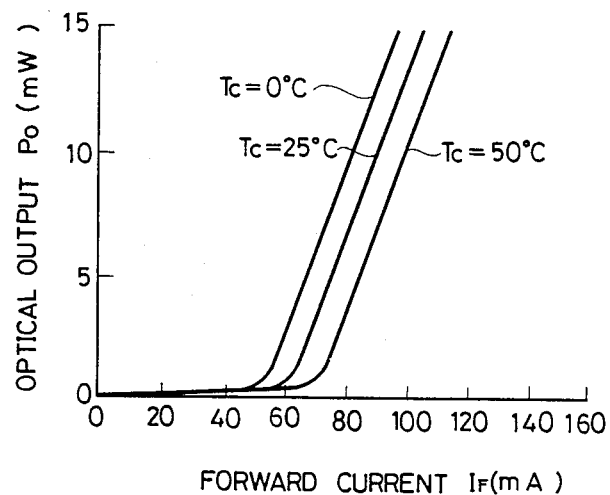
FIG. 5 is a graph showing the optical output of a typical light source as a function of drive current with temperature taken as a parameter.
Figure 6A:
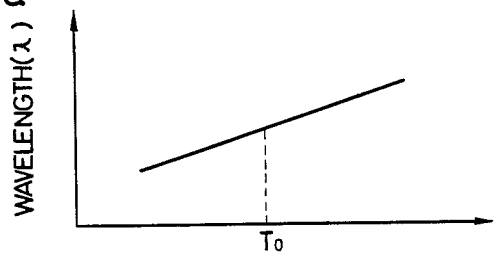
FIGS. 6a, 6b, 6c and 6d are graphs showing respectively the wavelength of light from a light source, its drive current, its optical output and the exposure sensitivity of a light-sensitive material as a function of temperature.
Figure 6B:
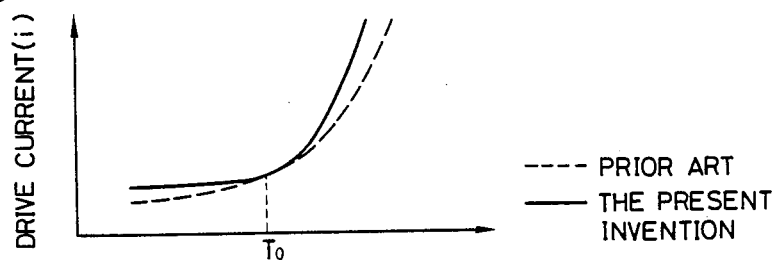

First, the operating principles of this image exposure apparatus are explained. A light-sensitive material generally has sensitivity vs. wavelength characteristics as are typically illustrated in FIG. 4a, in which symbols B, G and R denote blue, green and red lights, respectively. On the other hand, the characteristics of light sources such as LD (semiconductor laser) and LED (light-emitting diode) are subject to variation when their temperature changes; for example, the level of their optical output varies as shown in FIG. 5 or in FIG. 6c by a one-long-and-one-short dashed line, and the wavelength of light emitted from such light source also varies as shown in FIG. 6a.

Figure 4B:
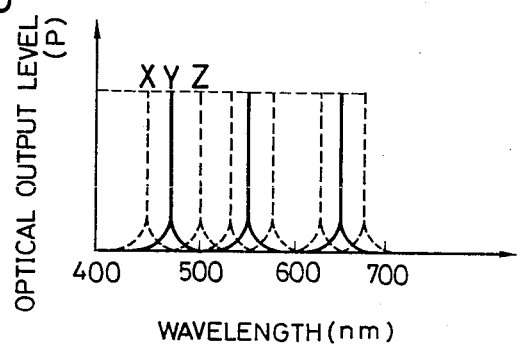
FIG. 4b is a graph showing the optical output vs. wavelength characteristics of a typical light source.
Figure 6C:
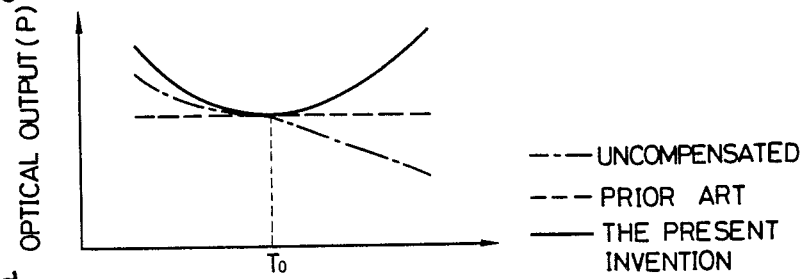

Suppose here that the level of optical output from a light source emitting light having a predetermined wavelength varies as indicated by a one-long-and-one-short dashed line in FIG. 6c in response to a deviation from a predetermined appropriate operating temperature $T_0$. In the prior art, this variation in optical output level is controlled with an APC circuit by adjusting the drive current as indicated by a dashed line in FIG. 6b in such a way that the level of optical output from the light source will be kept constant as indicated by a dashed line in FIG. 6c. In fact, however, the light emitted from the light source experiences variations in wavelength in response to a change in temperature as shown in FIG. 6a. Since the light-sensitive material has sensitivity vs. wavelength characteristics as shown in FIG. 4a, the exposure sensitivity of the light-sensitive material will drop at a temperature either lower or higher than $T_0$ as indicated by a dashed line in FIG. 6d. As shown in FIG. 4b, the oscillating spectrum which would normally at position y if a blue-light (B) source were operating at the appropriate temperature $T_0$ is shifted to position x on the shorter wavelength side if the operating temperature changes to a lower value, and shifted to position z on the longer wavelength side if the operating temperature changes to a higher value. Even if the level of optical output from the light source is controlled to be constant under these conditions, the exposure sensitivity of the light-sensitive material will drop as is apparent from FIG. 4a.

Figure 6D:
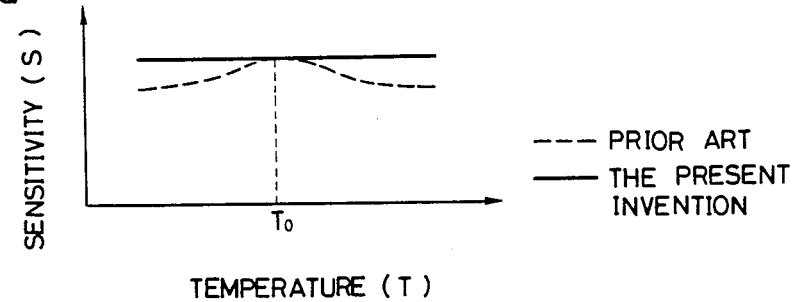

In order to maintain a constant exposure sensitivity as indicated by a solid line in FIG. 6d, the optical output of the light source has to be increased by an amount corresponding to the drop in sensitivity that has occurred as a result of deviation from $T_0$. To this end, the drive current flowing through the drive source for the light source has to be increased as indicated by a solid line in FIG. 6b.

Figure 7:
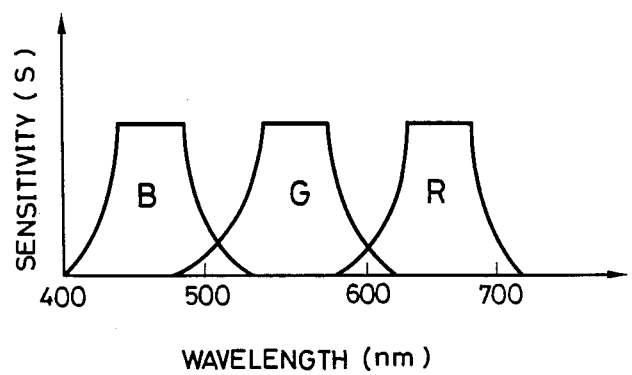
FIG. 7 is a graph showing the apparent exposure sensitivity characteristics of a light-sensitive material that are improved by using the image exposure apparatus of the present invention.

The image exposure apparatus shown in FIG. 1 meets this requirement by increasing the reference level supplied at point A of the comparator 18 in the APC circuit 20. As a result, the drive current supplied to the drive source 16 and hence the level of optical output from the light source is sufficiently increased to maintain the exposure sensitivity of the light-sensitive material at a constant level Stated more specifically, if the oscillating spectrum peak of the light source 12 shifts from position y to either x or z as shown in FIG. 4b in response to a change in the temperature of the light source, the voltage at point A is increased so as to control the level of optical output from the light source through the resulting increase in the reference level for the optical output. As a consequence, the exposure sensitivity characteristics of the light-sensitive material spread as shown in FIG. 7 to provide an apparently broad wavelength range of high sensitivity.

In the image exposure apparatus of the present invention which is generally indicated by 10 in FIG. 1, the change in the temperature of the light source 12 is detected with the temperature detector 22 and the resulting temperature change signal is subjected to A/D conversion in the A/D converter 26 and is thence transmitted to the CPU 32. At the same time, the memory 28 supplies the CPU 32 in the control means 24 with the wavelength vs. temperature characteristics of the light source 12 (see FIG. 6a) and the sensitivity vs. wavelength characteristics of the light-sensitive material (see FIG. 4a). The values of these characteristics are transmitted from the CPU 32 to the computing circuit 34 together with the temperature change signal. In response to the temperature change signal, the computing circuit 34 computes an optical output level that will keep the exposure sensitivity of the light-sensitive material at a constant level on the basis of the also supplied wavelength and sensitivity characteristics in accordance with the operating principles described in the previous paragraphs. The computed optical output level is sent back to CPU 32 as an optical output control signal and is thence transmitted to the D/A converter 36. The D/A converted optical output control signal is supplied to the positive (+) input terminal of the comparator 18 in the APC circuit 20.

The drive source 14 supplies a drive current (i) to the light source 12, which then produces a predetermined optical output by emitting light of a predetermined wavelength at a predetermined temperature ($T_0$). If the temperature of the light source 12 changes, the level of its optical output changes as shown in FIG. 5 and the wavelength of the light emitted also varies as shown in FIG. 4b and FIG. 6a. The changing level of optical output is detected by the photodetector 16 and a current corresponding to that optical output is supplied to the negative (−) terminal of op amp 17. The current signal is subjected to current/voltage (I/V) conversion in op amp 17 and is thence supplied to the negative (−) input terminal of the comparator 18.

The comparator 18 is supplied at its positive (+) input terminal (point A) with the already-described D/A converted optical output control signal which, in combination with resistor $R_4$, controls the reference level at point A so that it becomes equal to the computed level of optical output. If the currently detected level of optical output is lower than the computed level, the drive current flowing through the drive source 14 is increased, thereby raising the level of optical output from the light source 12. In the opposite case, the drive current is decreased so as to reduce the optical output level of the light source 12.

As described above, even if the optical output of a light source and the wavelength of emitted light vary as a result of a change in the temperature of the light source, the image exposure apparatus of the present invention controls the level of optical output from the light source in consideration of the sensitivity vs. wavelength characteristics of a light-sensitive material to be exposed, thereby allowing the exposure sensitivity of the light-sensitive material to remain constant without experiencing any deterioration.

EFFECT OF THE INVENTION

As described on the foregoing pages, during exposure of a light-sensitive material having high sensitivity over a narrow range of wavelength, both the level of optical output from a light source that emits light having a wavelength within said narrow wavelength range add the wavelength of that light will vary on account of the change in the temperature of that light source. If these variations occur, the exposure sensitivity of the light-sensitive material will deteriorate. In order to avoid this problem, the image exposure apparatus of the present invention computes an amount that compensates for the loss in the exposure sensitivity due to the variation in the wavelength of light emitted from the light source on the basis of the wavelength vs. temperature characteristics of the light source and the sensitivity vs. wavelength characteristics of the light-sensitive material. The apparatus electrically controls the level of optical output from the light source by adding the computed amount to the presently detected optical output level. As a result, the apparatus is capable of constantly providing the appropriate level of exposure in the face of changes in the temperature of the light source, thereby ensuring a record of high-quality image at all times of its operation.

According to the present invention, such control of the optical output level is performed with a simple electrical circuit configuration, so the image exposure apparatus of the present invention can be offered at low cost without attaching any large equipment such as a thermostatic device.

A further advantage of the present invention originates from the absence of the need to attain exact matching between the wavelength of light to be emitted from the light source and the wavelength of sensitivity of the light-sensitive material. This contributes to expanding the latitude of the sensitivity vs. wavelength characteristics of the light-sensitive material, thereby allowing greater flexibility in the choice of suitable types of the light source and light-sensitive material. Therefore, the image exposure apparatus of the present invention is especially adapted for performing image exposure of color light-sensitive materials and other light-sensitive materials that are intended to be exposed under a plurality of light sources.

What we claim is:

1. An image exposure apparatus which comprises: a light source for exposing a light-sensitive material with light having a predetermined wavelength; a drive source for driving said light source; a photodetector for detecting the optical output of said light source; a comparator for comparing the detected optical output level with a reference level; a temperature detector for detecting the change in the temperature of said light source; and control means which controls the optical output level of the light source on the basis of both the temperature change signal detected with said temperature detector and the output signal from said comparator in such a way that the exposure sensitivity of said light-sensitive material will not deteriorate in the face of the variation in the wavelength of light from said light source that occurs on account of the change in its temperature.

2. An image exposure apparatus according to claim 1 wherein said control means has a memory for storing the wavelength vs. temperature characteristics of the light source and the sensitivity vs. wavelength characteristics of the light-sensitive material, and an arithmetic processing unit which, in response to said temperature change signal, computes an optical output level for preventing the deterioration of the exposure sensitivity of said light-sensitive material on the basis of said wavelength and sensitivity characteristics, and which outputs an optical output control signal for controlling said drive source in such a way that said light source will produce the computed optical output level.

3. An image exposure apparatus according to claim 1 or 2 wherein the optical output control signal produced from said control means is supplied to the reference level input of said comparator and controls said reference level in such a way that the output signal from said comparator is supplied to said drive source so as to control the optical output level of said light source.

4. An image exposure apparatus according to claim 1 wherein said control means has a memory for storing the wavelength vs. temperature characteristics of the light source an the sensitivity vs. wavelength characteristics of the light-sensitive material, and an arithmetic processing unit which, in response to said temperature change signal and the output signal from said comparator, computes an optical output level for preventing the deterioration of the exposure sensitivity of said light-sensitive material on the basis of said wavelength and sensitivity characteristics, and which outputs an optical output control signal for controlling said drive source in such a way that said light source will produce the computed optical output level.

5. An image exposure apparatus according to claim 1 or 4 wherein the output signal from said comparator is supplied to the control means and the optical output control signal computed by said control means on the basis of said output signal is directly supplied to said drive source so as to perform direct control on the optical output level of said light source.

6. An image exposure apparatus which comprises;
a plurality of light sources each for exposing a light-sensitive material with light having a predetermined wavelength to form a color image; and for each of said light sources a respective drive source for driving said light source, photodetector for detecting the optical output of said light source, comparator for comparing the detected optical output level with a reference level, and temperature detector for detecting the change in the temperature of said light source; said image exposure apparatus further including control means which controls the optical output levels of the light sources on the basis of both the temperature change signals detected with said temperature detectors and the output signals from said comparators in such a way that the exposure sensitivity of said light-sensitive material will not deteriorate in the face of variations in the wavelengths of light from said light sources that occurs on account of the change in temperature.

7. An image exposure apparatus according to claim 6 wherein said control means has a memory for storing the wavelength vs. temperature characteristics of the light sources and the sensitivity vs. wavelength characteristics of the light-sensitive material, and an arithmetic processing unit which, in response to said temperature change signals, computes an optical output level for each light source for preventing deterioration of the exposure sensitivity of said light-sensitive material on the basis of said wavelength and sensitivity characteristics, and which outputs optical output control signals for controlling said drive sources in such a way that said light sources will produce the computed optical output levels.

8. An image exposure apparatus according to claim 6 or 7 wherein an optical output control signal produced from said control means is supplied to the reference level output of at least one of said comparators and controls said reference level in such a way that the output signal from the comparator is supplied to its respective drive source so as to control the optical output level of its respective light source.

9. An image exposure apparatus according to claim 6 wherein said control means has a memory for storing the wavelength vs. temperature characteristics of each of said light sources and the sensitivity vs. wavelength characteristics of the light-sensitive material, and an arithmetic processing unit which, in response to a temperature change signal and the output signal from a comparator of an associated light source level for preventing the deterioration of the exposure sensitivity of said light-sensitive material on the basis of said wavelength and sensitivity characteristics, and which outputs an optical output control signal for controlling the drive source of said associated light source in such a way that said associated light source will produce the computed optical output level.

10. An image exposure apparatus according to claim 6 or 9 wherein the output signal from comparator associated with a light source is supplied to the control means an the optical output control signal computed by said control means on the basis of said output signal is directly supplied to the drive source of the light source associated with the comparator so as to perform direct control on the optical output level of said light source.

* * * * *